US010679831B2

(12) United States Patent
Takeda

(10) Patent No.: US 10,679,831 B2
(45) Date of Patent: Jun. 9, 2020

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: HITACHI KOKUSAI ELECTRIC INC., Tokyo (JP)

(72) Inventor: Tsuyoshi Takeda, Toyama (JP)

(73) Assignee: KOKUSIA ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/854,426

(22) Filed: Dec. 26, 2017

(65) Prior Publication Data

US 2018/0182601 A1    Jun. 28, 2018

(30) Foreign Application Priority Data

Dec. 27, 2016 (JP) .................................. 2016-252878

(51) Int. Cl.
*H01J 37/32* (2006.01)
*H01L 21/66* (2006.01)
(Continued)

(52) U.S. Cl.
CPC .. *H01J 37/32935* (2013.01); *C23C 16/45542* (2013.01); *C23C 16/50* (2013.01);
(Continued)

(58) Field of Classification Search
CPC ........... H01L 21/0217; H01L 21/02274; H01L 21/67253; H01L 22/26
See application file for complete search history.

(56) References Cited

U.S. PATENT DOCUMENTS 5,489,361 A * 2/1996 Barbee .................. B24B 37/013
216/84
6,313,583 B1  11/2001 Arita et al.
(Continued)

FOREIGN PATENT DOCUMENTS

JP       2015-092637 A    5/2015

OTHER PUBLICATIONS

Chinese Office Action dated May 31, 2019 for the Chinese Patent Application No. 201711437688.X.
Chinese Office Action dated Jan. 19, 2020 for the Chinese Patent Application No. 201711437688.
(Continued)

*Primary Examiner* — Dale E Page
*Assistant Examiner* — Wilner Jean Baptiste
(74) *Attorney, Agent, or Firm* — Volpe and Koenig, P.C.

(57) ABSTRACT

Described herein is a technique capable of uniformly processing substrates. According to the technique described herein, there is provided a substrate processing apparatus including: a process chamber where a substrate is processed; a gas supply configured to supply a gas into the process chamber; a plasma generator configured to plasma-excite the gas supplied into the process chamber, the plasma generator including an electrode electrically connected to a high frequency power source; an impedance meter configured to measure an impedance of the plasma generator; a determiner configured to determine an amount of active species generated by the plasma generator based on the impedance measured by the impedance meter; and a controller configured to control the high frequency power source based on the amount of active species determined by the determiner.

9 Claims, 8 Drawing Sheets

(51) Int. Cl.
*H01L 21/67* (2006.01)
*C23C 16/50* (2006.01)
*C23C 16/52* (2006.01)
*C23C 16/455* (2006.01)
*C23C 16/505* (2006.01)
*H01L 21/02* (2006.01)

(52) U.S. Cl.
CPC ............ *C23C 16/505* (2013.01); *C23C 16/52* (2013.01); *H01J 37/32155* (2013.01); *H01L 21/67253* (2013.01); *H01L 22/26* (2013.01); *H01J 37/32183* (2013.01); *H01J 37/32541* (2013.01); *H01J 2237/2485* (2013.01); *H01J 2237/24564* (2013.01); *H01J 2237/327* (2013.01); *H01J 2237/3321* (2013.01); *H01L 21/0217* (2013.01); *H01L 21/0228* (2013.01); *H01L 21/02211* (2013.01); *H01L 21/02274* (2013.01)

(56) References Cited

U.S. PATENT DOCUMENTS

2009/0294275 A1* 12/2009 Shannon ........... H01L 21/67069
  204/164
2012/0091097 A1* 4/2012 Chen ................. H01J 37/32926
  216/59
2016/0358753 A1* 12/2016 Koshiishi .......... H01J 37/32082

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of Japanese Patent Application No. 2016-252878, filed on Dec. 27, 2016, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Description of the Related Art

Substrate processing is performed as one of semiconductor device manufacturing processes. The substrate processing may be performed by transferring a substrate into a process chamber of a substrate processing apparatus and activating gases such as source gas and reactive gas supplied into the process chamber into plasma to form various films such as an insulating film, semiconductor film and conductive film on the substrate or to remove the various films formed on the substrate. The plasma may be used, for example, to facilitate the deposition of a thin film, to remove impurities from the thin film, or to assist in the chemical reaction of the deposition sources.

However, when the plasma electrode deteriorates due to unexpected causes such as aging, fluctuations in the amount and the distribution of active species such as ions and radicals produced by the plasma may occur. Moreover, an abnormal discharge such as an arc discharge may occur in a plasma generator. As a result, it may be difficult to uniformly process the substrate.

SUMMARY

Described herein is a technique capable of uniformly processing substrates.

According to one aspect of the technique described herein, there is provided a substrate processing apparatus including: a process chamber where a substrate is processed; a gas supply configured to supply a gas into the process chamber; a plasma generator configured to plasma-excite the gas supplied into the process chamber, the plasma generator including an electrode electrically connected to a high frequency power source; an impedance meter configured to measure an impedance of the plasma generator, a determiner configured to determine an amount of active species generated by the plasma generator based on the impedance measured by the impedance meter; and a controller configured to control the high frequency power source based on the amount of active species determined by the determiner.

DETAILED DESCRIPTION

Embodiment

Hereinafter, an embodiment will be described with reference to FIGS. 1 through 6.

(1) Configuration of Substrate Processing Apparatus

<Heating Apparatus>

Figure 1:
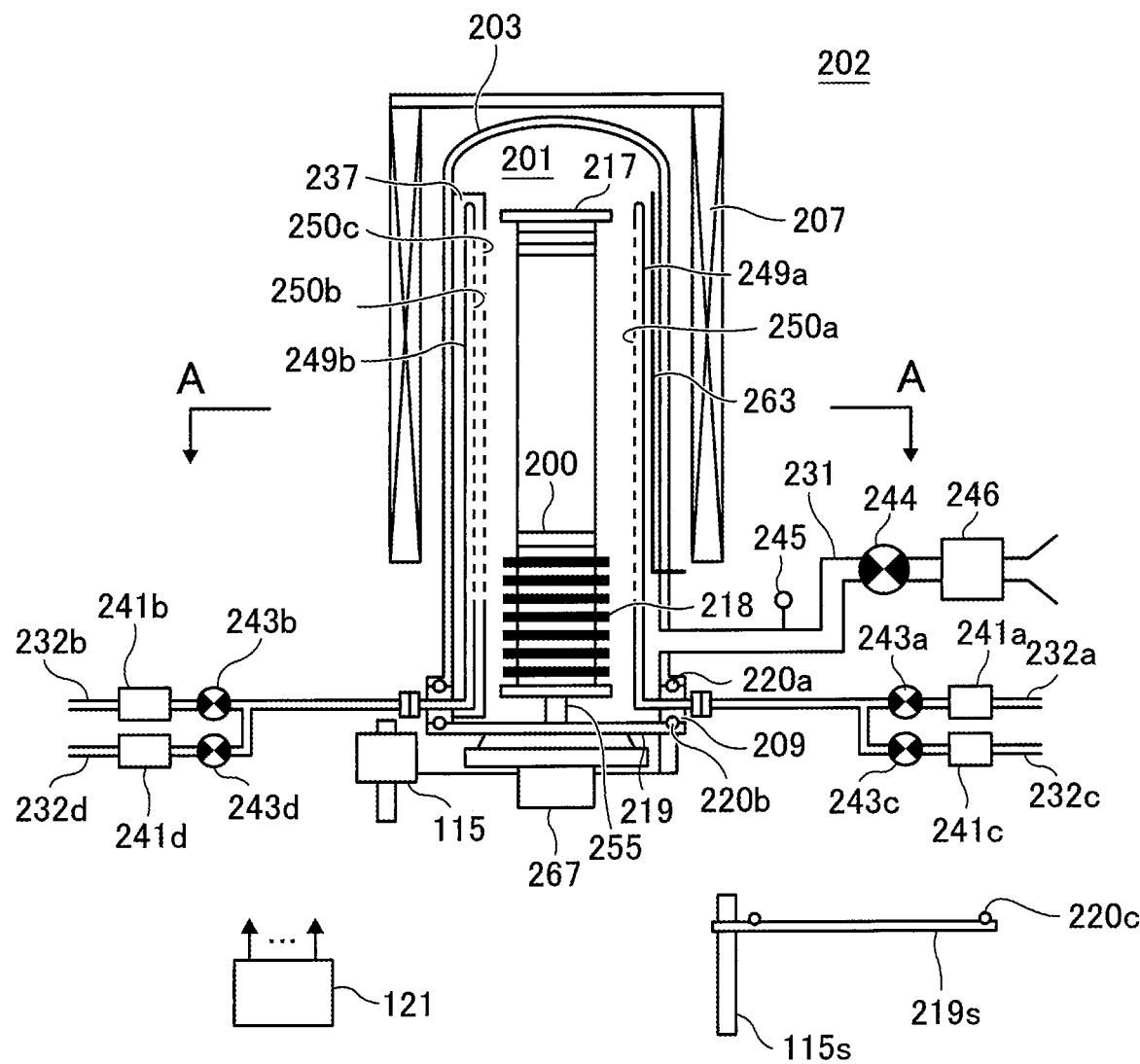
FIG. 1 schematically illustrates a vertical cross-section of a vertical type processing furnace of a substrate processing apparatus preferably used in an embodiment described herein.

As illustrated in FIG. 1, a processing furnace 202 is a vertical type processing furnace capable of accommodating substrates in multiple stages in the vertical direction and includes a heater 207 serving as a heating apparatus (heating mechanism). The heater 207 is cylindrical, and vertically installed while being supported by a heater base (support plate) (not shown). The heater 207 also functions as an activation mechanism (excitation unit) for activating (exciting) a gas into heat, which will be described later.

<Process Chamber>

A reaction tube 203 is provided in the heater 207 so as to be concentric with the heater 207. The reaction tube 203 is made of a heat-resistant material such as quartz ($SiO_2$) and silicon carbide (SiC), and cylindrical with a closed upper end and an open lower end. A manifold (inlet flange) 209 is provided under the reaction tube 203 so as to be concentric with the reaction tube 203. The manifold 209 is made of a metal such as stainless steel (SUS), and cylindrical with open upper and lower ends. The upper end of the manifold 209 is engaged with the lower end of the reaction tube 203 so as to support the reaction tube 203. An O-ring 220a serving as a sealing member is provided between the manifold 209 and the reaction tube 203. The reaction tube 203 is vertically installed with the manifold 209 supported by the heater base. A processing vessel (reaction vessel) is constituted by the reaction tube 203 and the manifold 209. A process chamber 201 is provided in the hollow cylindrical portion of the processing vessel. The process chamber 201 may accommodate a plurality of wafers 200 as substrates. The processing vessel is not limited to the above-described configuration. For example, the reaction tube 203 without the manifold 209 may be referred to as the processing vessel.

Nozzles 249a and 249b are provided in the process chamber 201 through sidewalls of the manifold 209. Gas supply pipes 232a and 232b are connected to the respective nozzles 249a and 249b. As such, the two nozzles 249a and 249b and the two gas supply pipes 232a and 232b may be provided at the reaction tube 203, and supply plural kinds of gases into the process chamber 201. When the reaction tube 203 without the manifold 209 is referred to as the processing vessel, the nozzles 249a and 249b are provided in the process chamber 201 through sidewalls of the reaction tube 203.

MFCs (Mass Flow Controllers) 241a and 241b serving as flow rate controllers (flow rate control units) and valves 243a and 243b serving as opening/closing valves are sequentially installed at the gas supply pipes 232a and 232b from the upstream sides toward the downstream sides of the gas supply pipes 232a and 232b, respectively. Gas supply pipes 232c and 232d for supplying an inert gas are connected to the downstream sides of the valves 243a and 243b installed at the gas supply pipes 232a and 232b, respectively. MFCs 241c and 241d serving as flow controllers (flow control units) and valves 243c and 243d serving as opening/closing valves are sequentially installed at the gas supply pipes 232c and 232d from the upstream sides toward the downstream sides of the gas supply pipes 232c and 232d, respectively.

Figure 2:
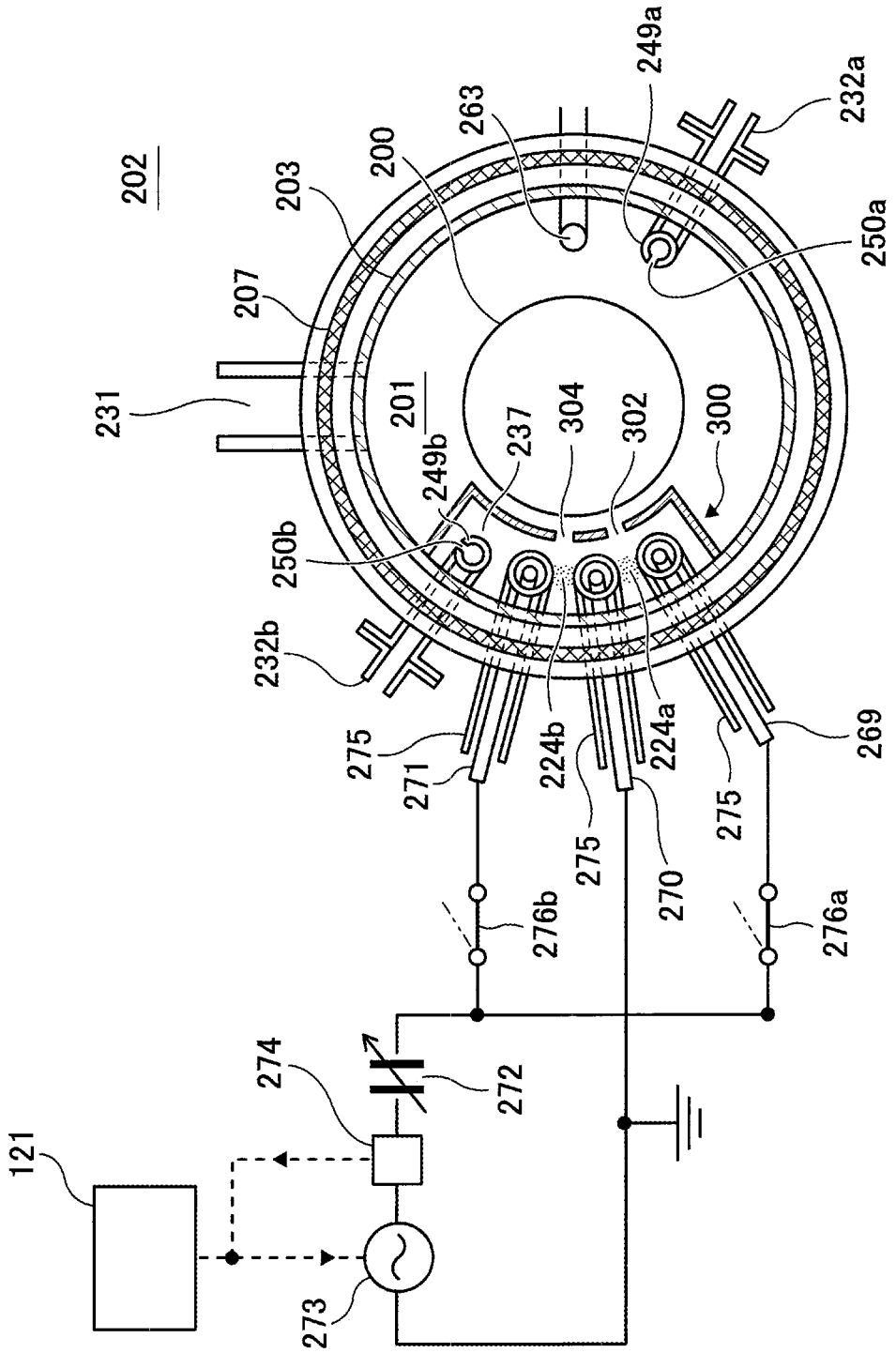
FIG. 2 schematically illustrates a cross-section taken along the line A-A of the vertical type processing furnace of the substrate processing apparatus shown in FIG. 1.

As shown in FIG. 2, the nozzle 249a is provided in an annular space between the inner wall of the reaction tube 203 and the wafers 200, and extends from bottom to top of the inner wall of the reaction tube 203 along the stacking direction of the wafers 200. That is, the nozzle 249a is provided in a region that horizontally surrounds a wafer arrangement region at one side of the wafer arrangement region where the wafers 200 are arranged along the wafer arrangement region. That is, the nozzle 249a is provided at sides of the end portions (peripheries) of the wafers 200 loaded into the process chamber 201 so as to be perpendicular to the surfaces (horizontal surface) of the wafers 200. A plurality of gas supply holes 250a for supplying gases is provided at side surfaces of the nozzle 249a. The plurality of gas supply holes 250a are open toward the center of the reaction tube 203, and configured to supply gases toward the wafers 200. The plurality of gas supply holes 250a is provided from the lower portion of the reaction tube 203 to the upper portion thereof. The plurality of gas supply holes 250a has the same area and pitch.

The nozzle 249b is provided in a buffer chamber 237 serving as a gas dispersion space. As shown in FIG. 2, the buffer chamber 237 is provided in a ring-shaped space formed between the inner wall of the reaction tube 203 and the wafers 200, and extends from bottom to top of the inner wall of the reaction tube 203 along the stacking direction of the wafers 200. That is, the buffer chamber 237 is defined by a buffer structure 300 horizontally surrounding the wafer arrangement region along the wafer arrangement region. The buffer structure 300 is made of an insulating material such as quartz. Gas supply holes 302 and 304 configured to supply gases are provided through arc-shaped front wall of the buffer structure 300 adjacent to the wafer 200. As shown in FIG. 2, the gas supply holes 302 and 304 face a plasma generation region 224a between the rod-shaped electrodes 269 and 270 and a plasma generation region 224b between the rod-shaped electrodes 270 and 271. The gas supply holes 302 and 304 are open toward the center of the reaction tube 203 to supply the gases to the wafer 200. The gas supply holes 302 and 304 may be provided from the lower portion to the upper portion of the reaction tube 203, and have the same area and the same pitch.

As shown in FIG. 2, the nozzle 249b is provided in the buffer structure 300, and extends from bottom to top of the inner wall of the reaction tube 203 along the stacking direction of the wafers 200. That is, the nozzle 249b is provided the buffer structure 300 which horizontally surround the wafer arrangement region at one side of the wafer arrangement region along the wafer arrangement region. That is, the nozzle 249b is provided at sides of the end portions (peripheries) of the wafers 200 loaded into the process chamber 201 so as to be perpendicular to the surfaces (horizontal surface) of the wafers 200. Gas supply holes 250b for supplying gases are provided at a side surface of the nozzle 249b. The gas supply holes 250b are open toward the arc-shaped front wall of the buffer structure 300, and configured to supply gases toward the arc-shaped front wall. Similar to the gas supply holes 250a, the gas supply holes 250b are provided from the lower portion to the upper portion of the reaction tube 203.

A source gas containing a predetermined element, for example, a silane source gas containing silicon (Si: predetermined element) is supplied into the process chamber 201 via the MFC 241a, the valve 243a and the nozzle 249a which are provided at the gas supply pipe 232a.

The silane source gas may include a halosilane source gas. For example, the halosilane source gas is a source gas containing silicon (Si) and a halogen element. The halosilane source gas includes a silane source containing a halogen group. The halogen group includes at least one halogen element selected from a group consisting of chlorine (Cl), fluorine (F), bromine (Br) and iodine (I).

For example, a source gas containing silicon (Si) and chlorine (Cl), that is, a chlorosilane source gas may be used as the halosilane source gas. For example, dichlorosilane ($SiH_2Cl_2$, abbreviated to DCS) gas may be used as the chlorosilane source gas.

A reactive gas such as a nitrogen (N)-containing gas, which is a reactant containing an element different from the predetermined element, is supplied into the process chamber 201 via the MFC 241b, the valve 243b and the nozzle 249b which are provided at the gas supply pipe 232b. As the nitrogen-containing gas, for example, a hydrogen nitride-based gas may be used. The hydrogen nitride-based gas may also be referred to as a substance constituted by only two elements of nitrogen and hydrogen. The hydrogen nitride-based gas serves as a nitriding gas, that is, a nitrogen source. For example, ammonia ($NH_3$) gas may be used as the hydrogen nitride-based gas.

The inert gas, such as nitrogen ($N_2$) gas, is supplied into the process chamber 201 via the gas supply pipes 232c and 232d provided with the MFCs 241c and 241d and the valves 243c and 243d, the gas supply pipes 232a and 232b and the nozzles 249a and 249b.

A source supply system serving as a first gas supply system is constituted by the gas supply pipe 232a, the MFC 241a and the valve 243a. A reactant supply system is constituted by the gas supply pipe 232b, the MFC 241b the valve 243b. An inert gas supply system is constituted by the gas supply pipes 232c and 232d, the MFCs 241c and 241d and the valves 243c and 243d. The source supply system, the reactant supply system and the inert gas supply system are collectively referred to as a "gas supply system (gas supply)".

<Plasma Generator>

As illustrated in FIG. 2, in the buffer chamber 237, three rod-shaped electrodes 269, 270 and 271 made of a conductor and having elongated thin and long structure are provided from the lower part to the upper part of the reaction tube 203 in the direction in which the wafers 200 are stacked. Each of the rod-shaped electrodes 269, 270 and 271 is provided parallel to the nozzle 249b. Each of the rod-shaped electrodes 269, 270 and 271 is covered and protected by an electrode protecting pipe 275 from an upper part to a lower part. The rod-shaped electrode 270 is connected to electrical ground serving as a reference potential, and the two rod-shaped electrodes 269 and 271 of the three rod-shaped electrodes 269, 270 and 271 disposed at both sides of the rod-shaped electrode 270 are connected to a high frequency power source 273 through a matching unit 272 and an impedance meter 274. That is, the rod-shaped electrodes 269 and 271 connected to the high frequency power source 273 and the rod-shaped electrode 270 connected to electrical ground are alternately arranged, and the rod-shaped electrode 270 servers as a common ground for the rod-shaped electrodes 269 and 271. In other words, the rod-shaped electrode 270 connected to electrical ground is disposed between the rod-shaped electrodes 269 and 271, and the rod-shaped electrodes 269 and 270 and the rod-shaped electrodes 271 and 270 respectively form pairs to generate plasma. By applying high frequency power to the rod-shaped electrodes 269 and 271 from the high frequency (RF) power source 273, plasma is generated in the plasma generation region 224a between the rod-shaped electrodes 269 and 270 and in the plasma generation region 224b between the rod-shaped electrodes 270 and 271.

The impedance meter 274 is provided between the matching unit 272 and the high frequency power source 273. The impedance meter 274 measures traveling wave and reflective wave of the high frequency wave. Specifically, the impedance meter 274 measures the load impedance of the rod-shaped electrodes 269 and 271 matched by the matching unit 272 or the degree of reflection of the high frequency wave. The impedance meter 274 measures the traveling wave and the reflective wave of the high frequency wave, and the measured value is fed back to the controller 121. The amount of plasma generated in the plasma generation regions 224a and 224b is controlled by the controller 121 controlling the high frequency power source 273 based on the measured values.

The values measured by the impedance meter 274 includes at least one of: the voltage ratio or the electrical power ratio of the reflective wave to the traveling wave of the high frequency wave; the phase difference between the reflective wave and the traveling wave of the high frequency wave; and reactance, conductance, susceptance, impedance or admittance calculated from the voltage ratio or the electrical power ratio and the phase difference.

A switch 276a is provided between the rod-shaped electrode 269 and the impedance meter 274. A switch 276b is provided between the rod-shaped electrode 271 and the impedance meter 274. When the switches 276a and 276b are provided between the rod-shaped electrode 269 and the impedance meter 274 and between the rod-shaped electrode 271 and the impedance meter 274, respectively, faulty electrode due to deterioration, disconnection and short circuit may be easily specified.

A plasma generator for generating plasma in the plasma generation regions 224a and 224b includes the rod-shaped electrodes 269, 270 and 271 and the matching unit 272. The plasma generator may further include the electrode protecting pipe 275, the switches 276a and 276b, the high frequency power source 273 and the impedance meter 274. The plasma generator serves as an activating mechanism (an exciting unit) for activating (exciting) a gas to plasma, which will be described later.

The electrode protecting pipe 275 is configured to insert each of the rod-shaped electrodes 269, 270 and 271 into the buffer chamber 237 in a state of being isolated from an atmosphere of the buffer chamber 237. If an oxygen concentration of the inside of the electrode protecting pipe 275 is set in the same level as an oxygen concentration of the outside air (atmosphere), the rod-shaped electrodes 269, 270 and 271 inserted into the electrode protecting pipe 275 respectively, are oxidized by heat of the heater 207. Therefore, by charging the inside of the electrode protecting pipe 275 with the inert gas such as an $N_2$ gas or by purging the inside of the electrode protecting pipe 275 with the inert gas such as an $N_2$ gas using an inert gas purge mechanism, the oxygen concentration of the inside of the electrode protecting pipe 275 can be lowered, thereby suppressing an oxidation of the rod-shaped electrodes 269, 270 and 271.

<Exhaust System>

The exhaust pipe 231 for exhausting the inner atmosphere of the process chamber 201 is provided at the reaction tube 203. A vacuum pump 246 serving as a vacuum exhauster is connected to the exhaust pipe 231 through a pressure sensor 245 and an APC (Automatic Pressure Controller) valve 244. The pressure sensor 245 serves as a pressure detector (pressure detection unit) to detect the inner pressure of the process chamber 201, and the APC valve 244 serves as an exhaust valve (pressure adjusting unit). With the vacuum pump 246 in operation, the APC valve 244 may be opened/closed to vacuum-exhaust the process chamber 201 or stop the vacuum exhaust. With the vacuum pump 246 in operation, the opening degree of the APC valve 244 may be adjusted based on the pressure detected by the pressure sensor 245, in order to control the inner pressure of the process chamber 201. An exhaust system includes the exhaust pipe 231, the APC valve 244 and the pressure sensor 245. The exhaust system may further include the vacuum pump 246. The exhaust pipe 231 may be provided not only in the reaction tube 203 but also provided at the manifold 209 similar to the nozzles 249a and 249b.

A seal cap 219 serving as a furnace opening cover can airtightly seal the lower end opening of the manifold 209, is provided under the manifold 209. The seal cap 219 is made of metal such as SUS, and is a disk-shaped. An O-ring 220b serving as a sealing member is provided on the upper surface of the seal cap 219 so as to be in contact with the lower end of the manifold 209. A rotating mechanism 267 to rotate a boat 217 described later is provided under the seal cap 219 opposite to the process chamber 201. The rotating mechanism 267 includes a rotating shaft 255 connected to the boat 217 through the seal cap 219. As the rotating mechanism 267 rotates the boat 217, the wafers 200 are rotated. The seal cap 219 may be moved upward/downward in the vertical direction by a boat elevator 115 provided outside the reaction tube 203 vertically and serving as an elevating mechanism. When the seal cap 219 is moved upward/downward by the boat elevator 115, the boat 217 may be loaded into the process chamber 201 or unloaded out of the process chamber 201. The boat elevator 115 serves as a transfer device (transfer mechanism) that loads the boat 217, that is, the wafers 200 into the process chamber 201 or unloads the boat 217, that is, the wafer 200s out of the process chamber 201. A shutter 219s is provided under the manifold 209. The shutter 219s serves as a furnace opening cover can airtightly seal the lower end opening of the manifold 209 while the seal cap is moved downward by the boat elevator 115. The shutter 219s is made of metal such as SUS, and is a disk-shaped. An O-ring 220c serving as a sealing member is provided on the upper surface of the shutter 219s so as to be in contact with the lower end of the manifold 209. The opening/closing operations of the shutter 219s such as the elevation and the rotation is controlled by a shutter opening/closing mechanism 115s.

<Substrate Retainer>

As shown in FIG. 1, the boat 217 serving as a substrate retainer aligns wafer or wafers 200, for example, 25 to 200 wafers 200 in the vertical direction and supports the plurality of wafers 200, while the wafers 200 are horizontally positioned and centered with each other. That is, the boat 217 supports the wafers 200 with predetermined intervals therebetween. The boat 217 is made of a heat-resistant material such as quartz and SiC. An insulating plate 218 is made of a heat-resistant material such as quartz and SiC, and provided in multiple stages under the boat 217.

As shown in FIG. 2, a temperature sensor 263 serving as a temperature detector is provided in the reaction tube 203. The state of electricity conducted to the heater 207 is adjusted based on the temperature detected by the temperature sensor 263, such that the internal temperature of the process chamber 201 has a desired temperature distribution. Similar to the nozzles 249a and 249b, the temperature sensor 263 is provided along the inner wall of the reaction tube 203.

<Control Device>

Figure 3:
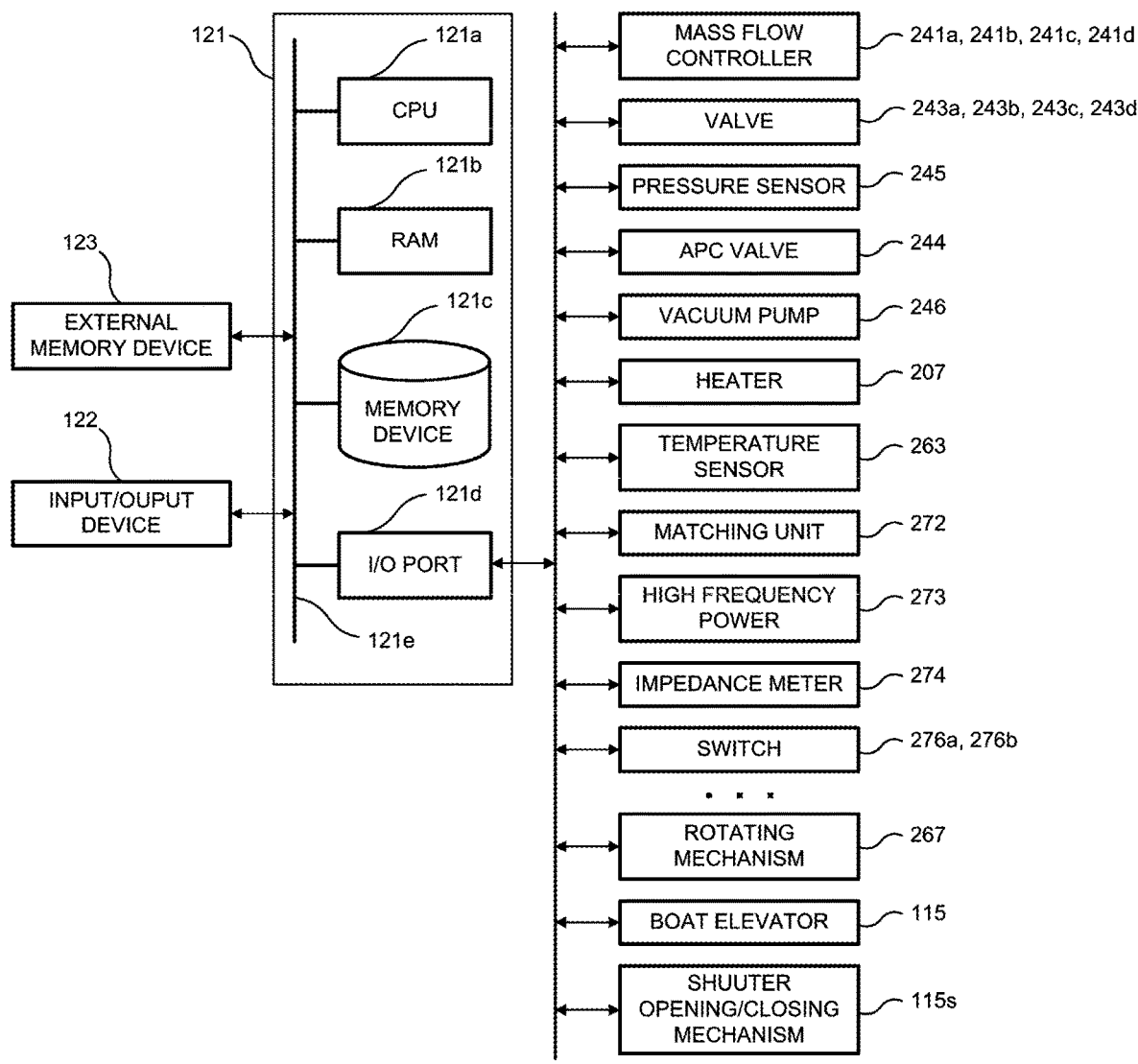
FIG. 3 is a block diagram schematically illustrating a configuration of a controller and components controlled by the controller of the substrate processing apparatus according to the embodiment.

Hereinafter, a control device will be described with reference to FIG. 3. As shown in FIG. 3, the controller 121 serving as the control device (control unit) is configured by a computer including a CPU (Central Processing Unit) 121a, a RAM (Random Access Memory) 121b, a memory device 121c and an I/O port 121d. The RAM 121b, the memory device 121c and the I/O port 121d may exchange data with the CPU 121a through an internal bus 121e. For example, an I/O device 122 such as a touch panel is connected to the controller 121.

The memory device 121c is configured by components such as a flash memory and HDD (Hard Disk Drive). A control program for controlling the operation of the substrate processing apparatus or a process recipe containing information on the sequence and conditions of a film-forming process (substrate processing) described later is readably stored in the memory device 121c. The process recipe is obtained by combining steps of the film-forming process described later such that the controller 121 can execute the steps to acquire a predetermine result, and functions as a program. Hereafter, the process recipe and the control program are collectively referred to as a program. The process recipe is simply referred to as a recipe. In this specification, "program" may indicate only the recipe, indicate only the control program, or indicate both of them. The RAM 121b is a work area where a program or data read by the CPU 121a is temporarily stored.

The I/O port 121d is connected to the above-described components such as the MFCs 241a through 241d, the valves 243a through 243d, the pressure sensor 245, the APC valve 244, the vacuum pump 246, the heater 207, the temperature sensor 263, the matching unit 272, the high frequency power source 273, the impedance meter 274, the switches 276a and 276b, the rotating mechanism 267, the boat elevator 115 and the shutter opening/closing mechanism 115s.

The CPU 121a is configured to read a control program from the memory device 121c and execute the read control program. Furthermore, the CPU 121a is configured to read a recipe from the memory device 121c according to an operation command inputted from the I/O device 122. According to the contents of the read recipe, the CPU 121a may be configured to control various operations such as a control operation of the rotating mechanism 267, flow rate adjusting operations for various gases by the MFCs 241a through 241d, opening/closing operations of the valves 243a through 243d, the adjusting operation of the high frequency power source 273 based on the impedance monitoring by the impedance meter 274, switching operations of the switches 276a and 276b, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, an operation of clockwise and counter-clockwise rotation, rotation angle and rotation speed of the boat 217 by the rotating mechanism 267, and an elevating operation of the boat 217 by the boat elevator 115.

The controller 121 may be embodied by installing the above-described program stored in an external memory device 123 into a computer, the external memory device 123 including a magnetic disk such as a hard disk, an optical disk such as CD, a magneto-optical disk such as MO, and a semiconductor memory such as a USB memory. The memory device 121c or the external memory device 123 may be embodied by a non-transitory computer readable recording medium. Hereafter, the memory device 121c and the external memory device 123 are collectively referred to as recording media. In this specification, "recording media" may indicate only the memory device 121c, indicate only the external memory device 123, and indicate both of the memory device 121c and the external memory device 123. In addition to the external memory device 123, a communication unit such as the Internet and dedicated line may be used as the unit for providing a program to a computer.

(2) Substrate Processing

Figure 4:
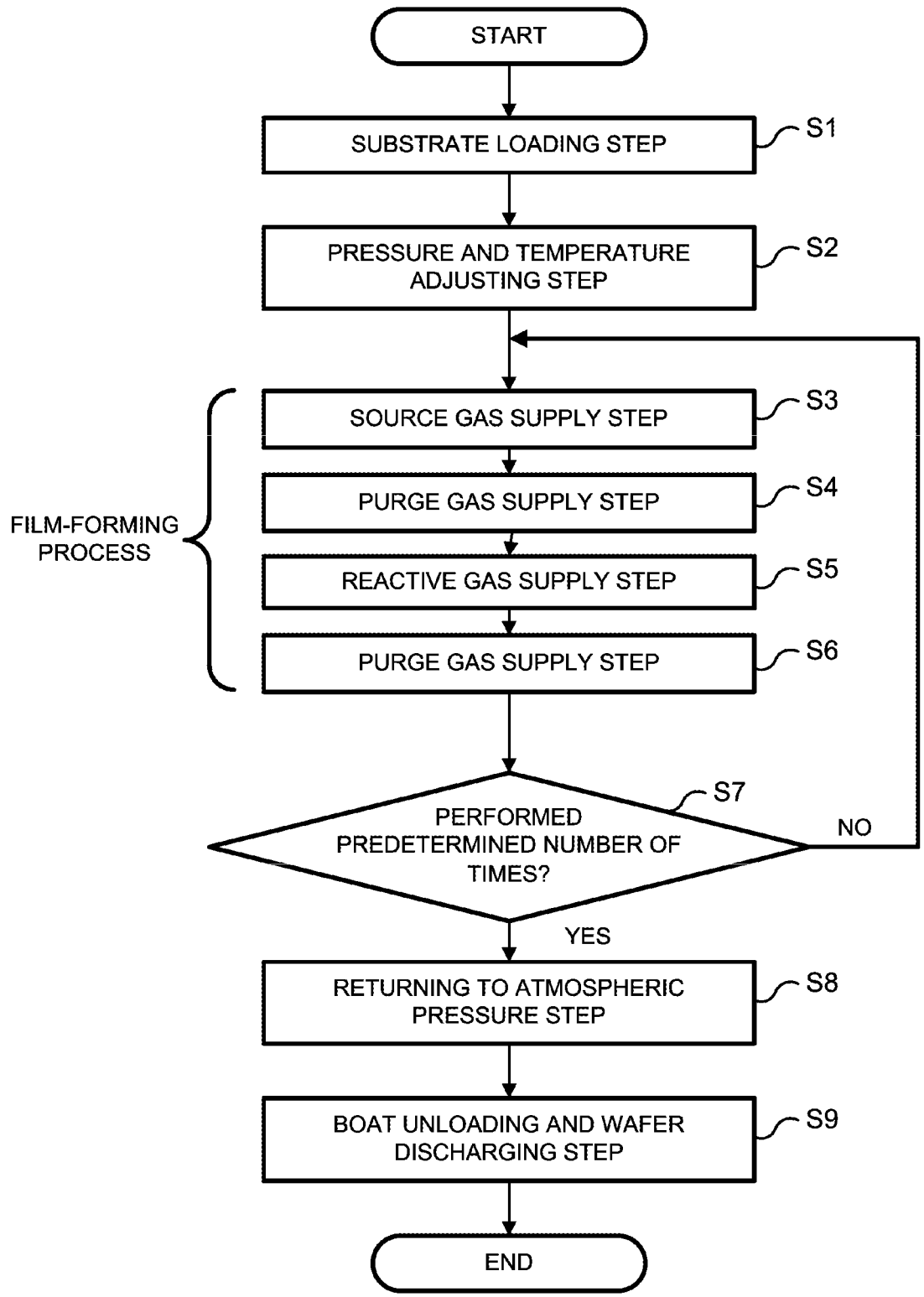
FIG. 4 is a flow chart of a substrate processing according to the embodiment.
Figure 5:
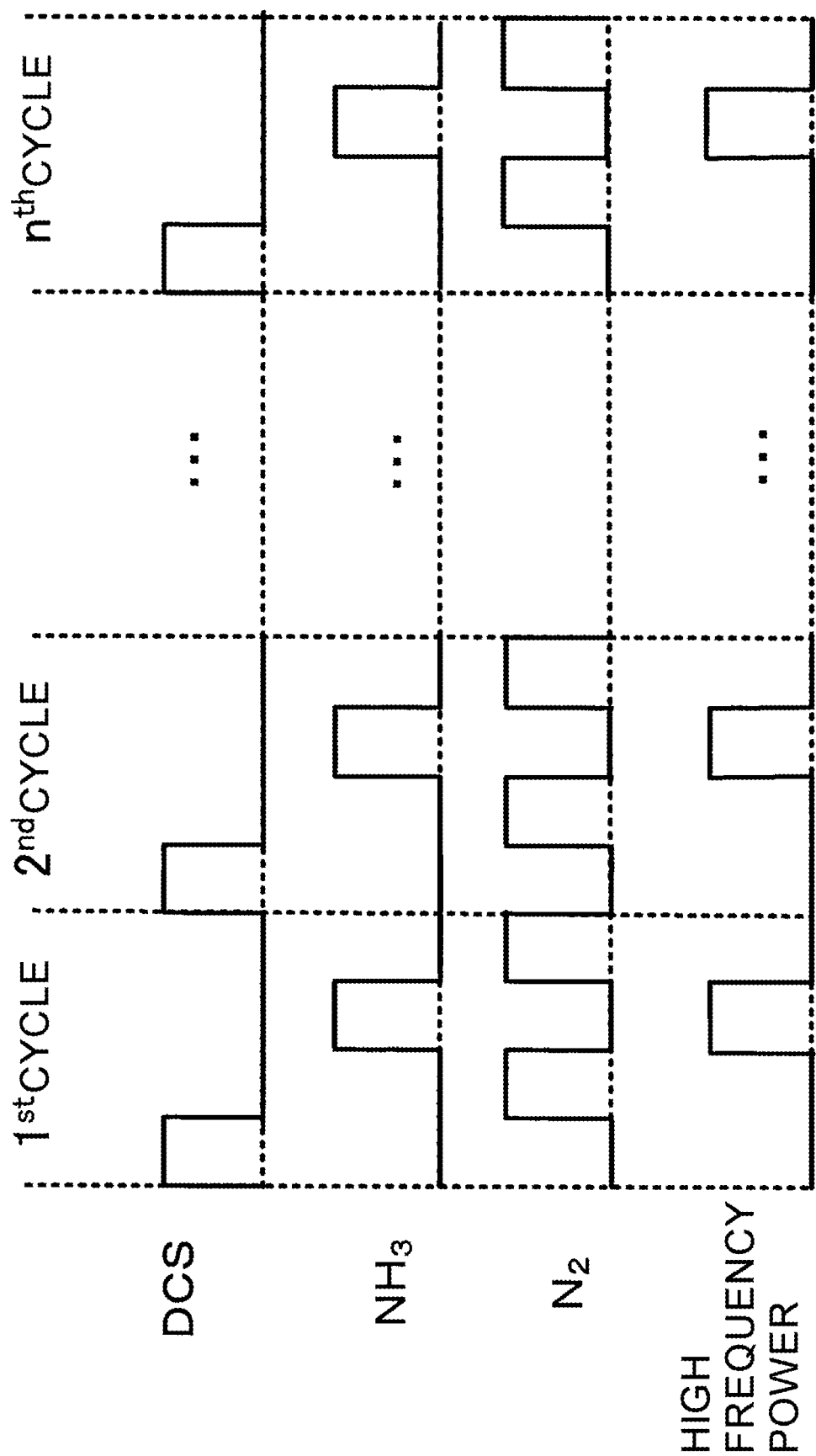
FIG. 5 is a timing diagram of a gas supply of the substrate processing according to the embodiment.

Next, an exemplary sequence of forming a film on a wafer 200, which is a substrate processing for manufacturing a semiconductor device, using the substrate processing apparatus will be described with reference to FIGS. 4 and 5. Herein, the components of the substrate processing apparatus are controlled by the controller 121.

Hereinafter, an example of forming a silicon nitride film (SiN film) containing silicon (Si) and nitrogen (N) on the wafer 200 will be described. The SiN film is formed on the wafer 200 by performing a cycle a predetermined number of times (once or more). The cycle includes a step of supplying DCS gas serving as the source gas onto the wafer 200 and a step of supplying plasma-excited ammonia ($NH_3$) gas serving as the reactive gas onto the wafer 200. The steps included in each cycle are performed non-simultaneously. A predetermined film may be formed on the wafer 200 in advance. A predetermined pattern may be formed on the wafer 200 or the predetermined film in advance.

Hereinafter, the above-described process flow of the film-forming process shown in FIG. 5 according to the embodiment may be illustrated as follows: arrows indicate the transition of the steps; and "n" indicates the number of times the steps are performed. Modified example, which will be described later, will be also illustrated in the same manner.

$$(DCS \rightarrow NH_3^*) \times n \rightarrow SiN$$

In this specification, "wafer" may refer to "a wafer itself" or refer to "a wafer and a stacked structure (aggregated structure) of predetermined layers or films formed on the surface of the wafer". That is, the wafer and the predetermined layers or films formed on the surface of the wafer may be collectively referred to as the wafer. In this specification, "surface of wafer" refers to "a surface (exposed surface) of a wafer" or "the surface of a predetermined layer or film formed on the wafer, i.e. the top surface of the wafer as a stacked structure". Thus, in this specification, "forming a predetermined layer (or film) on a wafer" may refer to "forming a predetermined layer (or film) on a surface of wafer itself" or refer to "forming a predetermined layer (or film) on a surface of a layer or film formed on the wafer", i.e. "forming a predetermined layer (or film) on a top surface of a stacked structure". In this specification, "substrate" and "wafer" may be used as substantially the same meaning.

<Substrate Loading Step: S1>

After the boat 217 is charged with wafers 200, the shutter is moved by the shutter opening/closing mechanism 115s and the lower end opening of the manifold 209 is opened (shutter opening). As shown in FIG. 1, the boat 217 charged with wafers 200 is lifted by the boat elevator 115 and loaded into the process chamber 201 (boat loading). With the boat 217 loaded, the seal cap 219 seals the lower end of the manifold 209 through the O-ring 220b.

<Pressure and Temperature Adjusting Step: S2>

The vacuum pump 246 vacuum-exhausts the process chamber 201 such that the inner pressure of the process chamber 201, that is, the pressure of the space in which the wafers 200 are present is set to a desired pressure (vacuum degree). At this time, the inner pressure of the process chamber 201 is measured by the pressure sensor 245, and the APC valve 244 is feedback controlled based on the measured pressure. The heater 207 heats the process chamber 201 such that the temperature of the wafers 200 in the process chamber 201 becomes a desired temperature. The state of electricity conducted to the heater 207 is feedback controlled based on the temperature detected by the temperature sensor 263, such that the internal temperature of the process chamber 201 has a desired temperature distribution. The rotating mechanism 267 starts to rotate the boat 217 and the wafers 200. Until at least the process for the wafers 200 is ended, the rotating mechanism 267 continuously rotates the boat 217 and the wafer 200.

<Film-Forming Process: S3, S4, S5 and S6>

Next, the film-forming process is performed by performing steps S3, S4, S5 and S6 sequentially.

<Source Gas Supply Step: S3>

In the source gas supply Step S3, DCS gas is supplied onto the wafer 200 in the process chamber 201.

The valve 243a is opened to supply the DCS gas into the gas supply pipe 232a. After the flow rate of DCS gas is adjusted by the MFC 241a, the DCS gas is supplied into the process chamber 201 through nozzle 249a and the plurality of gas supply holes 250a, and exhausted through the exhaust pipe 231. Simultaneously, the valve 243c may be opened to supply $N_2$ gas into the gas supply pipe 232c. After the flow rate of $N_2$ gas is adjusted by the MFC 241c, the $N_2$ gas is supplied with the DCS gas into the process chamber 201, and exhausted through the exhaust pipe 231.

In order to prevent the DCS gas from entering the nozzle 249b, the valve 243d may be opened to supply $N_2$ gas into the gas supply pipe 232d. The $N_2$ gas is supplied into the process chamber 201 through the gas supply pipe 232b and the nozzle 249b, and exhausted through the exhaust pipe 231.

For example, the flow rate of the DCS gas adjusted by the MFC 241a may range from 1 sccm to 6,000 sccm, preferably from 2,000 sccm to 3,000 sccm. For example, the flow rates of the $N_2$ gas adjusted by the MFCs 241c and 241d may range from 100 sccm to 10,000 sccm, respectively. For example, the inner pressure of the process chamber 201 may range from 1 Pa to 2,666 Pa, preferably from 665 Pa to 1,333 Pa. The time duration of supplying the DCS gas onto the wafers 200 may range from 1 second to 10 seconds, preferably from 1 second to 3 seconds.

The temperature of the heater 207 is controlled such that the temperature of the wafers 200 may range, for example, from 0° C. to 700° C., preferably from room temperature (25° C.) to 550° C., more preferably from 40° C. to 500° C. When the temperature of the wafers 200 is maintained at 700° C. or lower, preferably 550° C. or lower, more preferably 500° C. or lower, the heat applied to the wafers 200 may be reduced, and the thermal history of the wafers 200 may be properly controlled.

By supplying the DCS gas to the wafer 200 under the above-described conditions, a silicon-containing layer containing chlorine is formed on a base film on the wafer 200. The silicon-containing layer containing chlorine may be a silicon layer containing chlorine, an adsorption layer of DCS gas or combination thereof. Hereinafter, the silicon-containing layer containing chlorine is simply referred to as a "silicon-containing layer".

<Purge Gas Supply Step: S4>

After the silicon-containing layer is formed in the source gas supply Step S3, the valve 243a is closed to stop the supply of the DCS gas into the process chamber 201. With the APC valve 244 open, the vacuum pump 246 vacuum-exhausts the interior of the process chamber 201 to remove residual DCS gas or reaction byproducts which did not react or contributed to the formation of the silicon-containing layer from the process chamber 201. By maintaining the valves 243c and 243d open, the $N_2$ gas is continuously supplied into the process chamber 201. $N_2$ gas acts as a purge gas. The purge gas supply step S4 is optional and not required.

While the DCS gas is exemplified as the source gas in the source gas supply step S3, various gases may be used as the source gas. For example, aminosilane source gases such as tetrakisdimethylaminosilane gas, trisdimethylaminosilane gas, bisdimethylaminosilane gas, bisdiethylaminosilane gas, bistertiarybutylaminosilane gas, dimethylaminosilane gas, diethylaminosilane gas, dipropylaminosilane gas, diisopropylaminosilane gas, butylaminosilane gas and hexamethyldisilazane gas may be used as the source gas. Inorganic halosilane source gas such as monochlorosilane gas, trichlorosilane gas, tetrachlorosilane gas, hexachlorodisilane gas and octachlorotrisilane gas may also be used as the source gas. Inorganic silane source gases free of halogen such as monosilane gas, disilane gas and trisilane gas may also be used as the source gas.

While the $N_2$ gas is exemplified as the inert gas in the purge gas supply step S4, rare gases such as argon (Ar) gas, helium (He) gas, neon (Ne) gas and xenon (Xe) gas may be used instead of the $N_2$ gas as the inert gas.

<Reactive Gas Supply Step: S5>

After the silicon-containing layer is formed, in the reactive gas supply step S5, plasma-excited $NH_3$ is supplied onto the wafer 200 in the process chamber 201.

In the reactive gas supply step S5, the opening and the closing of the valves 243b, 243c and 243d is controlled in the same sequence as those of the valves 243a, 243c and 243d in the step S3. After the flow rate of $NH_3$ gas is adjusted by the MFC 241b, the $NH_3$ gas is supplied into the buffer chamber 237 through nozzle 249b. Simultaneously, high frequency power is applied to the rod-shaped electrodes 269, 270 and 271. The $NH_3$ gas supplied into the buffer chamber 237 is excited into plasma state (activated by plasma), supplied into the process chamber 201 as active species $NH_3^*$, and exhausted through the exhaust pipe 231.

For example, the flow rate of the $NH_3$ gas adjusted by the MFC 241b may range from 100 sccm to 10,000 sccm, preferably from 1,000 sccm to 2,000 sccm. For example, the high frequency power applied to the rod-shaped electrodes 269, 270 and 271 may range from 50 W to 600 W. For example, the inner pressure of the process chamber 201 may range from 1 Pa to 500 Pa. By using the plasma, $NH_3$ gas is activated even when the inner pressure of the process chamber 201 is relatively low as described above. The time duration of supplying the active species obtained by plasma-exciting the $NH_3$ gas onto the wafers 200 may range from 1 second to 180 seconds, preferably from 1 second to 60 seconds. Other conditions are same as those of the step S3.

By supplying $NH_3$ gas to the wafer 200 under the conditions described above, the silicon-containing layer formed on the wafer 200 is plasma-nitrided. During the nitridation, Si—Cl bonds and Si—H bonds included in the silicon-containing layer are broken by energy of plasma-excited $NH_3$ gas. The chlorine (Cl) and hydrogen (H) are separated from the silicon (Si) in the silicon-containing layer. The dangling bond of the silicon in the silicon-containing layer produced due to the separation of chlorine and hydrogen enables the bonding of the silicon in the silicon-containing layer to the nitrogen (N) in the $NH_3$ gas to form a Si—N bond. As the reaction progresses, the silicon-containing layer is changed (modified) into a layer containing silicon and nitrogen, i.e. a silicon nitride layer (SiN layer).

In order to modify the silicon-containing layer into the SiN layer, it is preferable that the supplied $NH_3$ gas is plasma-excited. When $NH_3$ gas is supplied under a non-plasma atmosphere, the energy required to nitride the silicon-containing layer is insufficient at the above-described temperature range. Therefore, it is difficult to fully separate chlorine or hydrogen from the silicon-containing layer or fully nitride the silicon-containing layer to increase the number of the Si—N bond.

The $NH_3$ gas supplied into the buffer chamber 237 is excited into plasma state (activated by plasma) to be supplied into the process chamber 201 as active species $NH_3^*$, and exhausted through the exhaust pipe 231.

<Purge Gas Supply Step: S6>

After the silicon-containing layer is modified to the SiN layer, the valve 243b is closed to stop the supply of the $NH_3$ gas into the process chamber 201. The high frequency power applied to the rod-shaped electrode 269, 270 and 271 is stopped. The $NH_3$ gas and by-products are removed from the process chamber 201 according to the same sequence and conditions as those of the step S4 (S6). The purge gas supply step S6 is optional and not required.

While the $NH_3$ gas is exemplified as a nitriding agent in the reactive gas supply step S5, gases such as diazene ($N_2H_2$) gas, hydrazine ($N_2H_4$) gas and $N_3H_8$ gas may be used as the plasma-excited hydrogen nitride-based gas.

While the $N_2$ gas is exemplified as the inert gas in the purge gas supply step S6, rare gases may be used in place of the $N_2$ gas as the inert gas similar to the step S4.

<Performing Predetermined Number of Times: S7>

By performing a cycle wherein the steps S3, S4, S5 and S6 are performed non-simultaneously in order a predetermined number of times (n times), a SiN film having a predetermined composition and a predetermined thickness is formed on the wafer 200 (S7). It is preferable that the cycle is performed a plurality of times. It is preferable that the SiN film having a desired thickness is formed by laminating SiN layers thinner than the desired thickness by repeating the cycle a plurality of times until the desired thickness obtained.

<Returning to Atmospheric Pressure Step: S8>

After the film-forming process is performed, the $N_2$ gas is supplied into the process chamber 201 through each of the gas supply pipes 232c and 232d and then exhausted through the exhaust pipe 231. The $N_2$ gas acts as a purge gas. The process chamber 201 is thereby purged such that the gas or the reaction by-products remaining in the process chamber 201 are removed from the process chamber 201 (purging). Thereafter, the inner atmosphere of the process chamber 201 is replaced with an inert gas (substitution by inert gas), and the inner pressure of the process chamber 201 is returned to atmospheric pressure (S8).

<Boat Unloading and Wafer Discharging Step: S9>

Then, the seal cap 219 is lowered by the boat elevator 115 and the lower end of the manifold 209 is opened. The boat 217 with the processed wafers 200 charged therein is unloaded from the reaction tube 203 through the lower end of the manifold 209 (boat unloading). After the boat is unloaded, the shutter 219s is moved. The lower end of the manifold 209 is sealed by the shutter 219s through the O-ring 220c (shutter closing). The processed wafers 200 are taken out of the reaction tube 203 and then discharged from the boat 217 (wafer discharging). An empty boat 217 may be loaded back into the process chamber 201 after the wafer discharging.

(3) Plasma Control Operation

Next, the operation of the controller 121 capable of controlling plasma processing will be described in detail with reference to FIG. 6. The controller 121 also functions as a plasma control device capable of controlling generation of plasma.

Figure 6:
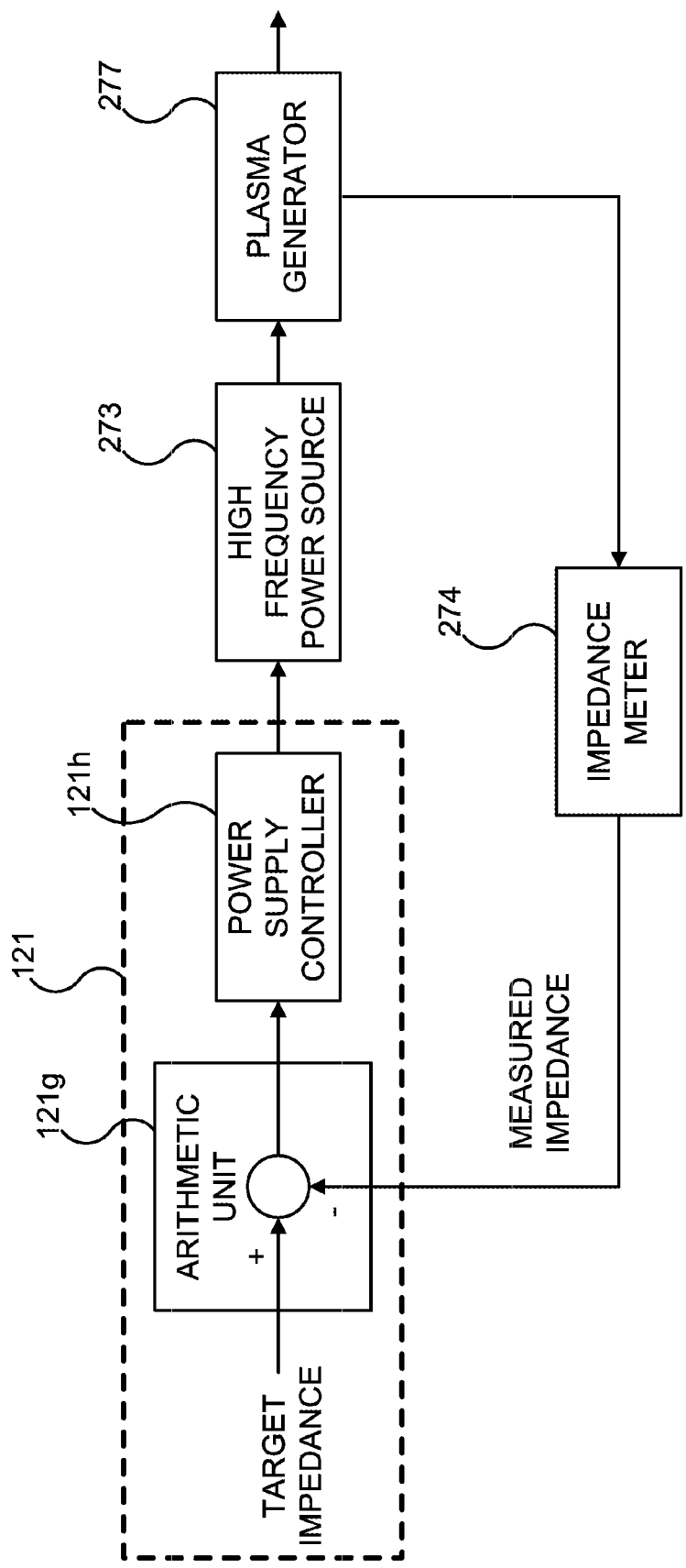
FIG. 6 is a block diagram schematically illustrating a configuration of an impedance control of the substrate processing according to the embodiment.

As shown in FIG. 6, the control loop is constituted by an arithmetic unit 121g, a power supply controller 121h, the high frequency power source 273, a plasma generator 277 and the impedance meter 274. The arithmetic unit 121g of the controller 121 and the electrical power supply controller 121h may be collectively referred to as a determiner (determination unit). The controller 121 may also be referred to as the determiner (determination unit).

Target impedance is an impedance at which plasma is adequately generated in plasma processing such as film-forming process and etching process. The target impedance includes resistance and reactance and is stored in the memory device 121c.

The arithmetic unit 121g is, for example, the CPU 121a. The arithmetic unit 121g compares the target impedance, which is read from the memory device 121c, with the impedance measured by the impedance meter 274 and determines the electrical power or the frequency of the high frequency power source 273 controlled by the electrical power supply controller 121h based on the result of the comparison.

The electrical power supply controller 121h is configured to control the electrical power or the frequency of the high frequency power source 273 applied to the plasma generator 277 according to the result of the comparison carried out by the arithmetic unit 121g. Specifically, the electrical power supply controller 121h is configured to control the high frequency power source 273 to adjust the electrical power or the frequency applied to the rod-shaped electrodes 269, 270 and 271 such that the impedance of the plasma generator 277 is maintained at a predetermined value to control the amount of plasma generated in the plasma generation regions 224a and 224b.

The impedance meter 274 is configured to detect the state of the plasma generator 277. Specifically, the impedance meter 274 is configured to output a load impedance. That is, the impedance meter 274 is configured to: measure the impedance of the matching unit 272 and the rod-shaped electrodes 269 and 271 shown in FIG. 2, and the phase difference of the traveling wave and the reflective wave in the coaxial cable; perform arithmetic operation to offset the internal impedance of the matching unit 272; and then output the load impedance which is the sum of the impedance of the rod-shaped electrodes 269 and 271 and the impedance of the plasma. The load impedance which is the sum or the average of the impedances of the rod-shaped electrodes 269 and 271 is exemplified in FIG. 2.

The arithmetic unit 121g compares the impedance measured by the impedance meter 274 with the target impedance. Based on the result of the comparison, the impedance of the plasma generator 277 is maintained at the target impedance by appropriately controlling the electrical power or the frequency of the high frequency power source 273 by the electrical power supply controller 121h. Accordingly, the gas supplied to the buffer chamber 237 can be excited into plasma at a constant concentration.

Impedance Z, which is a complex number, may be expressed as Equation 1 below where R in real part is resistance, and X in imaginary part is reactance.

$$Z = R + jX \qquad \text{[Equation 1]}$$

The equivalent circuit of the electrical circuit consisting of the rod-shaped electrodes 269, 270 and 271 and the generated plasma is regarded as a series circuit consisting of resistor, coil and capacitor.

The resistance R and the reactance X when the plasma is not generated may be expressed as Equations 2 and 3 below, respectively.

$$R = R_0 \qquad \text{[Equation 2]}$$

$$X = \omega L_0 - \frac{1}{\omega C_0} \qquad \text{[Equation 3]}$$

In Equations 2 and 3, $\omega = 2\pi f$ (where f is the frequency of the high frequency power source 273), $R_0$ is the resistance of the electrodes, $L_0$ is the inductance of the electrodes, and $C_0$ is the capacitance between the electrodes.

The resistance R and the reactance X when the plasma is generated may be expressed as Equations 4 and 5 below, respectively.

$$R = R_0 + R_p \qquad \text{[Equation 4]}$$

$$X = \omega L_0 - \frac{1}{\omega C_p} \qquad \text{[Equation 5]}$$

In Equations 4 and 5, $R_p$ is the resistance of the plasma, and $C_p$ is the capacitance between the electrodes and the plasma.

The capacitance $C_p$ is determined by the thickness of a plasma sheath around the electrodes. The plasma sheath is referred to as non-plasma layer formed on the surfaces of wafers and electrodes because the plasma comes in contact with their surfaces and disappears. Since the plasma sheath becomes thinner as the plasma density increases, the capacitance $C_p$ increases as the plasma density increases. On the other hand, since the plasma sheath becomes thicker as the plasma density decreases, the capacitance $C_p$ decreases as the plasma density decreases. Accordingly, the controller 121 is able to determine the amount of plasma based on the deviation of the reactance X and the degree of reflection of the high frequency wave. The degree of reflection of the high frequency wave may be determined, for example, from the electrical power ratio or the voltage ratio of the traveling wave to the reflective wave by the impedance meter 274.

Since the plasma density affects the reactance X of the impedance Z, the reactance X increases as the plasma density and the amount of the active species increase.

That is, the amount of the active species may be determined by the impedance Z (=R+jX) measured by the impedance meter 274. Specifically, the amount of active species may be determined by the reactance X of the impedance Z measured by the impedance meter 274.

When the absolute value of the reactance X measured by the impedance meter 274 is within a predetermined range stored in advance in the memory device 121c, the electrical power supply controller 121h determines the amount of the generated active species to be adequate. When the absolute value of the reactance X measured by the impedance meter 274 is out of the predetermined range stored in the memory device 121c, the electrical power supply controller 121h determines the amount of the generated active species to be in adequate, i.e. the amount of generated active species is small or large. In that case, the electrical power supply controller 121h is configured to adjust the electrical power or the frequency of the high frequency power source 273 applied to the electrodes. That is, the electrical power supply controller 121h is configured to properly maintain the amount of the active species by adjusting the electrical power or the frequency of the high frequency power source 273.

When the plasma is not generated normally, the absolute value of the reactance X of the impedance Z becomes quite large. When the absolute value of the reactance X measured by the impedance meter 274 is larger than a reference value Xs, the controller 121 is configured to determine that the plasma is not adequately generated, and alert the user using an alarm.

The controller 121 is configured to determine that the plasma is adequately generated when the reactance X measured by the impedance meter 274 is within a predetermined range and the phase difference of the high frequency wave is within a predetermined range.

When the electrode is deteriorated or disconnected, the resistance R of impedance Z increases. When the electrode is short-circuited, the resistance R of the impedance Z decreases. When the electrode is deteriorated, disconnected or short-circuited, the phase difference of the high frequency wave increases.

Therefore, by comparing the resistance R of the impedance Z measured by the impedance meter 274 with a reference value Rs, the controller 121 is able to determine whether the electrode is deteriorated, disconnected or short-circuited.

Specifically, the controller 121 is configured to compare the resistance R measured by the impedance meter 274 with a reference value Rs1, which is the lower limit of the predetermined range in which the plasma is adequately generated. When the resistance R is lower than the reference value Rs1 and the magnitude (power or voltage) of the reflective wave of the high frequency wave is out of the predetermined range, the controller 121 is configured to determine the electrode to be short-circuited, and alert the user using an alarm.

Specifically, the controller 121 is configured to compare the resistance R measured by the impedance meter 274 with a reference value Rs2, which is the upper limit of the predetermined range in which the plasma is adequately generated. When the resistance R is higher than the reference value Rs2 and the magnitude (power or voltage) of the reflective wave of the high frequency wave is out of the predetermined range, the controller 121 is configured to determine the electrode to be deteriorated or disconnected, and alert the user using an alarm.

The controller 121 is configured to control switching operations of the switches 276a and 276b the high frequency wave to the rod-shaped electrodes 269 and 270 or the rod-shaped electrodes 271 and 270 such that an electrode defective due to deterioration, disconnection or short-circuit can be determined.

That is, the controller 121 is configured to compare the reactance or the resistance of the impedance measured by the impedance meter 274 with the reference values or the predetermined range, compare the magnitude of the reflective wave of the high frequency wave with the reference values or the predetermined range to determine the amount of active species, presence of plasma, abnormal discharge of plasma, and deterioration, disconnection and short-circuit of electrode.

Hereinafter, an exemplary experiment will be described in detail. The exemplary experiment was performed using the substrate processing apparatus described above. The temperature of the process chamber 201 in the reactive gas supply step S5 of the substrate processing was set to room temperature, the inner pressure of the process chamber 201 was set to 66 Pa, the frequency f of the high frequency power source 273 was set to 28 MHz, and a CCP (capacitively coupled plasma) of $NH_3$ gas was generated using the rod-shaped electrodes 269, 270 and 271 having a length of 0.6 m, a diameter of 12 mm and a DC resistance of less than 1Ω in the buffer chamber 237. The matching unit 272 includes a coil connected to the rod-shaped electrodes 269, 270 and 271 in series and a vacuum variable condenser connected to the rod-shaped electrodes 269, 270 and 271 in parallel. The impedance meter 274 is connected between the matching unit 272 and the high frequency power source 273 using a coaxial cable. The impedance was measured by the impedance meter 274.

According to the exemplary experiment, when the active species is appropriately generated and the amount of the active species generated by the controller 121 is appropriately controlled, the absolute value of the reactance X measured by the impedance meter 274 is represented by the Equation 6, and the reflective wave of the high frequency wave was less than 10% of the incident wave.

$$|X| < 100 Ω \qquad \text{[Equation 6]}$$

When the controller 121 is not able to adequately control the impedance such that the absolute value of the reactance X measured by the impedance meter 274 is in the range expressed as Equation 7, and the reflective wave of the high frequency wave is less than 10%, the amount of generated active species is small due to an abnormal plasma generation.

$$|X| \geq 100 Ω \qquad \text{[Equation 7]}$$

The controller 121 is configured to adjust the electrical power or the frequency of the high frequency power source 273 such that the absolute value of the reactance X of the plasma generator 277 satisfies the range expressed as Equation 8 below.

$$|X| < 100 Ω \qquad \text{[Equation 8]}$$

When the absolute value of the reactance X measured by the impedance meter 274 is equal to or greater than 100, the controller 121 is configured to decide that the amount of the generated active species is not adequate and adjust the electrical power or the frequency of the high frequency power source 273. In the above-described exemplary experiment, the limit of the reactance, within which an appropriate amount of active species is stably generated, is X=*100Ω.

When the electrode is deteriorated or disconnected, the resistance R measured by the impedance meter 274 satisfies Equation 9 below, and the reflective wave of the high frequency wave is equal to or greater than 10%.

$$R > 50 Ω \qquad \text{[Equation 9]}$$

When the electrode is short-circuited, the resistance R measured by the impedance meter 274 satisfies Equation 10 below, and the reflective wave of the high frequency wave is equal to or greater than 10%.

$$R < 5 Ω \qquad \text{[Equation 10]}$$

That is, when the resistance R measured by the impedance meter 274 is greater than 50Ω, the controller 121 may decide that the electrode is deteriorated or disconnected according to the results described above. When the resistance R is smaller than 5Ω, the controller 121 may decide that the electrode is short-circuited. The controller 121 may be configured to warn the user of the decision thereof by issuing an alarm. By selectively switching the switch 276a and the switch 276b and measuring the impedance, the controller 121 can identify the defective electrode.

Effects According to the Embodiment

One or more advantageous effects described below are provided according to the embodiment.

(a) According to the embodiment, the controller adjusts the electrical power or the frequency of the high frequency power source based on the load impedance measured by the impedance meter such that the impedance is maintained within the predetermined range even when the electrode or the environment of the electrode or is changed. The characteristics of plasma may be maintained and film-forming characteristics or the etching characteristics may be stabilized.

(b) According to the embodiment, since the film-forming characteristics or the etching characteristics may be stabilized by maintaining the characteristics of the plasma, the productivity or stability of wafer processing is improved.

(c) According to the embodiment, by providing three electrodes in the buffer chamber and switches for the electrodes, the amount of active species supplied to the surface of the wafer may be increased. According to the embodiment, when the electrode is deteriorated, disconnected or short-circuited, the defective electrode may be identified.

Modified Example

Figure 7:
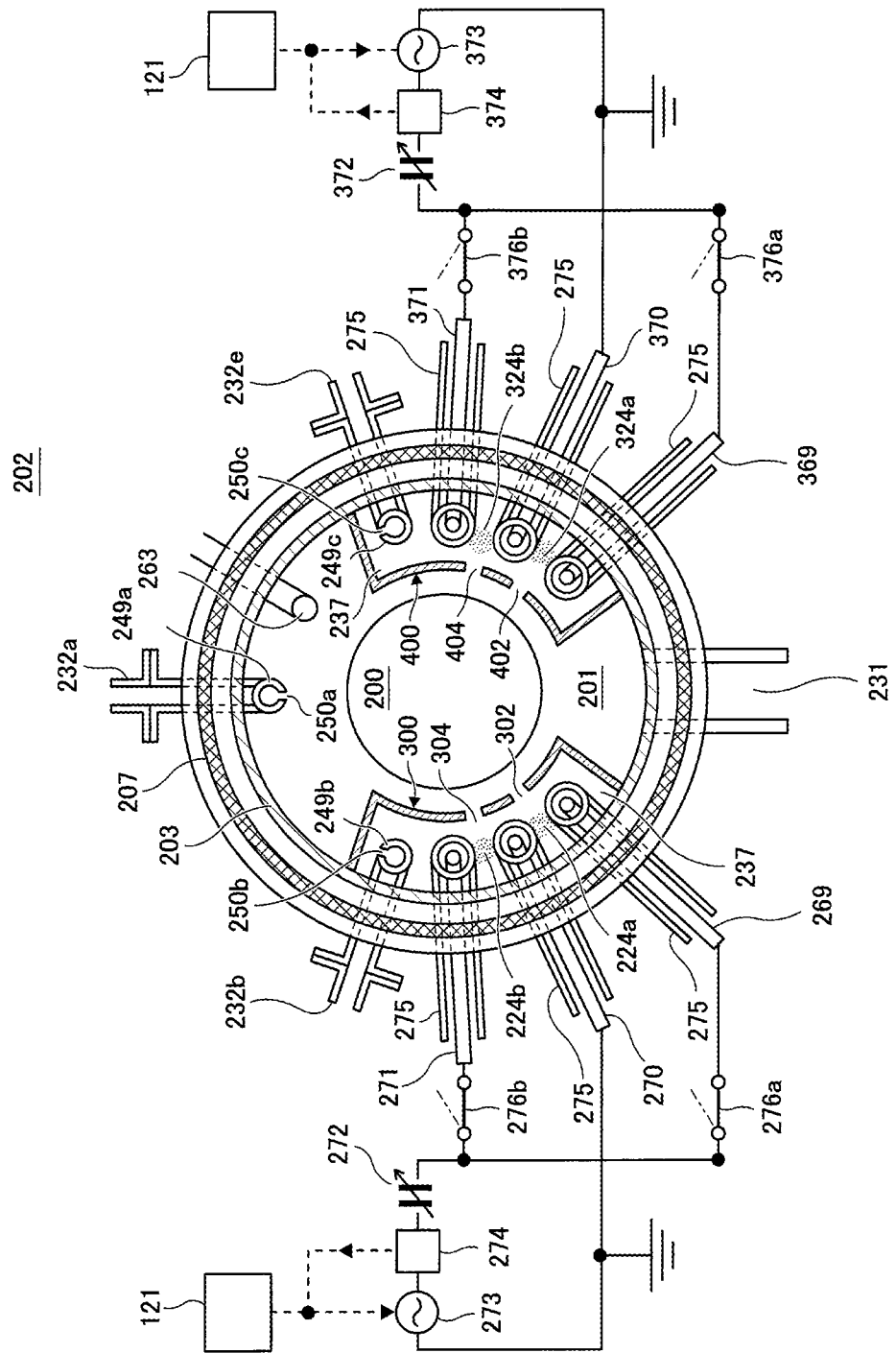
FIG. 7 schematically illustrates a horizontal cross-section of a modified example of the vertical type processing furnace of the substrate processing apparatus preferably used in the embodiment.

Next, a modified example of the embodiment is described with reference to FIGS. 7 and 8. Only the components of the modified example different from the above-described embodiment will be described below. The components same as those of the embodiment among the components of the modified example are not described.

According to the embodiment, the buffer structure 300 is provided on the inner wall of the reaction tube 203 and the rod-shaped electrode 269, 270 and 271 covered by the electrode protecting pipe 275 and the nozzle 249b are provided in the buffer structure 300. According to the modified example, a buffer structure 400, which is similar to the buffer structure 300, is further provided on the inner wall of the reaction tube 203.

Rod-shaped electrodes 369, 370 and 371, each of which is covered by the electrode protecting pipe 275, and a nozzle 249c are provided in the buffer structure 400. The rod-shaped electrodes 369 and 371 disposed at both sides of the rod-shaped electrode 370 are connected to the high frequency power source 373 via the matching unit 372 and the impedance meter 374. The rod-shaped electrode 370 is electrically grounded, i.e. connected to a reference potential. The nozzle 249c is connected to a gas supply pipe 232e and is configured to supply a modifying gas (e.g., hydrogen ($H_2$) gas). A plurality of gas supply ports 250c for supplying gas are provided on the side surface of the nozzle 249c from the bottom to the top of the reaction tube 203. The gas supply ports 250c are open toward the flat sidewall of the buffer structure 400 rather than the arc-shaped front wall of the buffer structure 400 such that the gas is supplied toward the flat sidewall of the buffer structure 400. Gas supply ports 402 and gas supply ports 404 configured to supply gas into the process chamber 201 are provided in the arc-shaped front wall of the buffer structure 400. As shown in FIG. 7, the gas supply ports 402 and 404 face a plasma generation region 324a between the rod-shaped electrodes 369 and 370 and a plasma generation region 324b between the rod-shaped electrodes 370 and 271. The gas supply ports 402 and 404 are open toward the center of the reaction tube 203 to supply the gases to the wafer 200. The gas supply ports 402 and 404 may be provided from the lower portion to the upper portion of the reaction tube 203, and have the same area and the same pitch.

The impedance meter 374 is provided between the matching unit 372 and the high frequency power source 373. The impedance meter 374 measures the load impedance matched by the matching unit 372 or the degree of reflection of the high frequency wave.

A switch 376a is provided between the rod-shaped electrode 369 and the impedance meter 374. A switch 376b is provided between the rod-shaped electrode 371 and the impedance meter 374.

A first plasma generator for generating plasma in the plasma generation regions 224a and 224b includes the rod-shaped electrodes 269, 270 and 271 and the matching unit 272. A second plasma generator for generating plasma in the plasma generation regions 324a and 324b includes the rod-shaped electrodes 369, 370 and 371 and the matching unit 372.

The buffer structure 300 and the buffer structure 400 are provided symmetric to each other with respect to a line connecting the centers of the exhaust pipe 231 and the reaction tube 203. The nozzle 249a is provided to face the exhaust pipe 231 with the wafer 200 therebetween. The nozzle 249b and the nozzle 249c are provided in the buffer chamber 237 to be space apart from the exhaust pipe 231.

Figure 8:
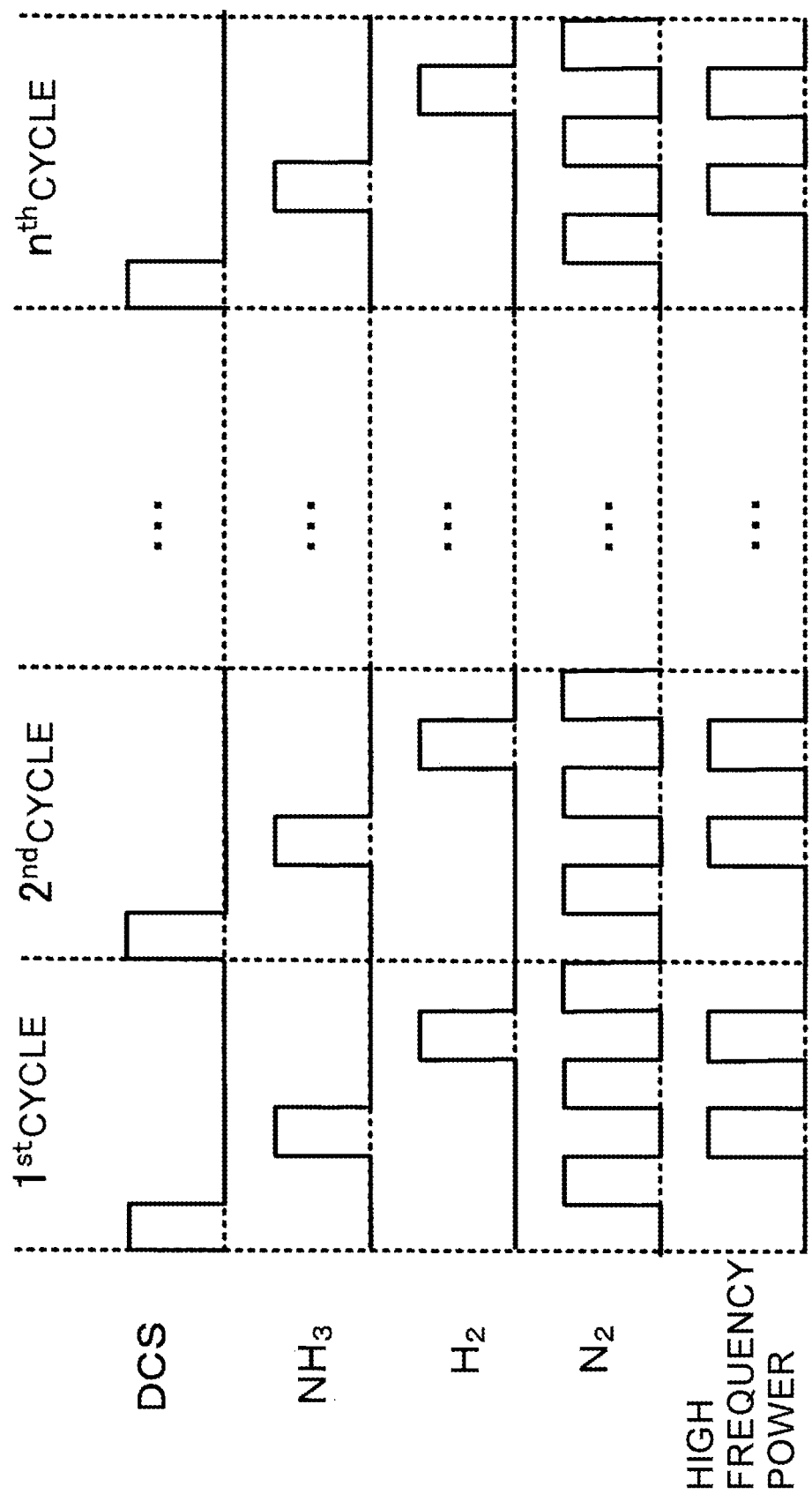
FIG. 8 is a timing diagram of a gas supply of the substrate processing according to the modified example of the vertical type processing furnace of the substrate processing apparatus.

As shown in FIG. 8, by performing the step of supplying DCS gas as a source gas, the step of supplying a plasma-excited $NH_3$ gas as a reactive gas, and the step of supplying plasma-excited $H_2$ gas as a modifying gas non-simultaneously a predetermined number of times (one or more times), a silicon nitride film (SiN film), which is a film containing Si and N, is formed on the wafer 200.

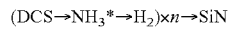

(DCS→$NH_3$*→$H_2$)×n→SiN

As described above, when the $H_2$ gas is plasma-excited and supplied after the $NH_3$ gas, which is the reactive gas supplied through the nozzle 249b, is plasma-excited and supplied to the wafer 200, the above-described technique can be applied.

According to the modified example, the two buffer structures 300 and 400 having plasma generators including the high frequency power sources 273 and 373, the impedance meters 274 and 374 and the matching units 272 and 372, respectively, are provided.

The impedance meters 274 and 374 and the high frequency power sources 273 and 373 are electrically connected to the controller 121. Accordingly, the controller 121 is capable of performing plasma control for each buffer chamber 237 provided in the buffer structures 300 and 400 independently. That is, the controller 121 is configured to monitor the impedances of the plasma generators via the impedance meters 274 and 374 and independently control the high frequency power sources 273 and 373 such that any fluctuation in the amount of the active species in each buffer chamber 237 is suppressed. For example, the controller 121 is configured to increase the electrical power of the high frequency power source when the impedance of one of the plasma generators is high.

The controller 121 is configured to control the high frequency power sources 273 and 373 based on the impedances measured by the impedance meters 274 and 374, respectively, and controls the plasma generators to generate plasma accordingly. As a result, substrate processing may be performed efficiently.

Specifically, the controller 121 may be configured to control the high frequency power source 373 for plasma-exciting $H_2$ gas based on the impedance of $NH_3$ gas measured by the impedance meter 274 and fed back to the controller 121, and control the high frequency power source 273 for plasma-exciting $NH_3$ gas based on the impedance of $H_3$ gas measured by the impedance meter 374 and fed back to the controller 121 such that the two plasma generators are controlled in interrelated manner.

According to the modified example, sufficient amount of active species can be supplied to the wafer even when the electrical power of the high frequency wave of each of the two plasma generator is reduced compared to the embodiment provided with a single plasma generator. Therefore, the uniformity of the film formed on the surface of the wafer may be improved. In the modified example, one impedance meter and one high frequency power source are provided for each plasma generator rather than one impedance meter and one high frequency power source for two plasma generators. This configuration facilitates the determination of defective plasma generator when a fault such as a disconnection occurs in the plasma generators. Since the distance between the high frequency power source and the electrode may be easily adjusted, the deviation of RF power applied to electrodes due to the distance may be suppressed.

While the technique is described by way of the above-described embodiment, the above-described technique is not limited thereto. The above-described technique may be modified in various ways without departing from the scope of the technique. For example, while the matching unit 272, the high frequency power source 273 and the impedance meter 274 are illustrated as individual components in the above-described embodiment, the technique is not limited thereto. For example, the technique may also be applied when at least one of the matching unit 272 and the high frequency power source 273 is integrated into the impedance meter 274.

According to the above-described embodiment, two buffer structures are provided and two different plasma-excited reactive gases are supplied to the wafer from the two buffer structures, respectively. However, the above-described technique is not limited thereto. The above-described technique may also be applied when a single type of plasma-excited reactive gas is supplied to the wafer from both of the two buffer structures.

While the reactive gas is supplied after the source gas is supplied according to the above-described embodiment, the above-described technique is not limited thereto. The above-described technique may be applied when the order of the source gas and the reactive gas is changed. That is, the above-described technique may be applied when the source gas is supplied after the reactive gas is supplied. By changing the order of the gases, the quality or the composition of the film may be changed.

While the above-described embodiment is described based on forming the silicon nitride film (SiN film) on the wafers 200, the above-described technique is not limited thereto. The above-described technique may also be applied to the formations of other films on the wafers 200. For example, the above-described technique may be applied to the formations of silicon-based oxide films such as silicon oxide film (SiO film), silicon oxycarbide film (SiOC film), silicon oxycarbonitride film (SiOCN film) and silicon oxynitride film (SiON film). For example, the above-described technique may also be applied to the formations of silicon-based nitride films such as silicon carbonitride film (SiCN film), silicon boronitride film (SiBN film) and silicon boron carbonitride film (SiBCN film). Oxygen (O)-containing gas, carbon (C)-containing gas such as $C_3H_6$, nitrogen (N)-containing gas such as $NH_3$ and boron (B)-containing gas such as $BCl_3$ may be used as the source gas to form the above-described films.

The above-described technique may also be applied to the formations an oxide film (metal-based oxide film) or a nitride film (metal-based nitride film) containing a metal element such as titanium (Ti), zirconium (Zr), hafnium (Hf), tantalum (Ta), niobium (Nb), aluminum (Al), molybdenum (Mo) and tungsten (W). The above-described technique may also be applied to the formations of metal-based films such as TiN film, TiO film, TiOC film, TiOCN film and TiON film.

For example, various gases such as tetrakis (dimethylamino) titanium ($Ti[N(CH_3)_2]_4$, abbreviated as TDMAT) gas, tetrakis (ethylmethylamino) hafnium ($Hf[N(C_2H_5)(CH_3)]_4$, abbreviated as TEMAH) gas, tetrakis (ethylmethylamino) zirconium ($Zr[N(C_2H_5)(CH_3)]_4$, abbreviated as TEMAZ) gas, trimethylaluminum ($Al(CH_3)_3$, abbreviated as TMA) gas, titanium tetrachloride ($TiCl_4$) gas and hafnium tetrachloride ($HfCl_4$) gas may be used as the source gas to form the above-described films. As the reactive gas, the above-described reactive gas such as $C_3H_6$, $NH_3$ and $BCl_3$ may be used.

The above-described technique may also be applied to the formations of a metalloid film containing a metalloid element or the metal-based film containing metal element. The processing sequences and the processing conditions of the formation process of metalloid film or metal film may be substantially the same as those of the film-forming process according to the embodiment or the modified example. Even when the above-described technique is applied to the formation process of metalloid film or metal film, the same advantageous effects as the above-described embodiment or the modified example may be obtained.

The recipes used in the film-forming process are preferably prepared individually according to the process contents and stored in the memory device 121c via an electric communication line or an external memory device 123. When starting various processes, the CPU 121a is configured to select an appropriate recipe among the recipes stored in the memory device 121c according to the process contents. Thus, various films having different composition ratios, qualities and thicknesses may be formed in reproducible manner by using a single substrate processing apparatus. In addition, since the burden on the operator may be reduced, various processes may be performed quickly while avoiding a malfunction of the apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the telecommunication line or the recording medium in which the new recipe is stored. The existing recipe already stored in the substrate processing apparatus may be directly changed to a new recipe by operating the I/O device 122 of the substrate processing apparatus.

According to the technique described herein, substrates may be processed uniformly.

What is claimed is:

1. A substrate processing apparatus comprising:
a process chamber where a substrate is processed;
a gas supply configured to supply a gas into the process chamber;
a plasma generator configured to plasma-excite the gas supplied into the process chamber to generate a plasma, the plasma generator including a first electrode and a second electrode, each of which is electrically connected to a high frequency power source, wherein the plasma is generated between the first electrode and the second electrode;
an impedance meter configured to measure a total impedance of an impedance of the first electrode, an impedance of the second electrode, and an impedance of the plasma generated between the first electrode and the second electrode;
a first switch electrically connected between the impedance meter and the first electrode;
a second switch electrically connected between the impedance meter and the second electrode; and
a controller configured to:
determine an amount of active species of the plasma generated by the plasma generator based on the total impedance measured by the impedance meter,
control the high frequency power source based on the amount of active species; and
detect deterioration or disconnection of the first electrode and the second electrode by selectively switching the first switch and the second switch and measuring the total impedance.

2. The substrate processing apparatus of claim 1, wherein the controller is further configured to control the high frequency power source to adjust an electrical power or a frequency thereof applied to each of the first electrode and the second electrode based on a comparison between the total impedance measured by the impedance meter and a predetermined impedance.

3. The substrate processing apparatus of claim 2, wherein the controller is further configured to control the high frequency power source to adjust an electrical power or a frequency thereof applied to each of the first electrode and the second electrode such that an impedance of the plasma generator is maintained at the predetermined impedance.

4. The substrate processing apparatus of claim 2, wherein the controller is further configured to control the high frequency power source to adjust an electrical power or a frequency thereof applied to each of the first electrode and the second electrode such that the amount of active species generated by the plasma generator is adjusted.

5. The substrate processing apparatus of claim 1, wherein the total impedance comprises at least reactance, and the controller is further configured to determine the amount of active species to be adequate when the reactance is within a predetermined range.

6. The substrate processing apparatus of claim 1, wherein the total impedance comprises at least reactance, and the controller is further configured to determine the amount of active species to be inadequate when the reactance is out of a predetermined range.

7. The substrate processing apparatus of claim 1, wherein the total impedance comprises at least resistance, and the controller is further configured to determine the first electrode and the second electrode to be short-circuited when the resistance is lower than a lower limit of a predetermined range.

8. The substrate processing apparatus of claim 1, wherein the total impedance comprises at least resistance, and the controller is further configured to determine the first electrode and the second electrode to be deteriorated or disconnected when the resistance is higher than an upper limit of a predetermined range.

9. The substrate processing apparatus of claim 1, wherein the controller is further configured to control switching operations of the first switch and the second switch such that a high frequency wave is selectively applied thereto.

\* \* \* \* \*